United States Patent
Ting et al.

(10) Patent No.: US 8,039,330 B2
(45) Date of Patent: Oct. 18, 2011

(54) METHOD FOR MANUFACTURING SEMICONDUCTOR DEVICE

(75) Inventors: Shyh-Fann Ting, Kaohsiung County (TW); Cheng-Tung Huang, Kaohsiung (TW); Li-Shian Jeng, Taitung (TW); Kun-Hsien Lee, Tainan (TW); Wen-Han Hung, Kaohsiung (TW); Tzyy-Ming Cheng, Hsincu (TW)

(73) Assignee: United Microelectronics Corp., Hsinchu (TW)

( * ) Notice: Subject to any disclaimer, the term of this patent is extended or adjusted under 35 U.S.C. 154(b) by 135 days.

(21) Appl. No.: 11/620,970

(22) Filed: Jan. 8, 2007

(65) Prior Publication Data
US 2008/0166840 A1  Jul. 10, 2008

(51) Int. Cl.
*H01L 21/04* (2006.01)
(52) U.S. Cl. ........ 438/197; 438/478; 438/491; 438/510; 438/514; 438/520; 438/525; 438/528
(58) Field of Classification Search .............. 438/302, 438/506, 514, 659, 174, 194, 217, 305, 306, 438/510, 478, 491, 520, 525, 528; 257/E21.618, 257/E21.633
See application file for complete search history.

(56) References Cited

U.S. PATENT DOCUMENTS

| | | | |
|---|---|---|---|
| 6,268,640 B1 * | 7/2001 | Park et al. | 257/607 |
| 7,060,547 B2 * | 6/2006 | Chen et al. | 438/197 |
| 2007/0037326 A1 * | 2/2007 | Chen et al. | 438/151 |
| 2007/0254461 A1 * | 11/2007 | Wei et al. | 438/514 |
| 2008/0070370 A1 * | 3/2008 | Wu et al. | 438/301 |

FOREIGN PATENT DOCUMENTS

TW  480598  3/2002

OTHER PUBLICATIONS

Chinese Examination Report of Taiwan Application No. 096101268, dated Dec. 22, 2009.
Chen et al., Removal of end-of-range defects in Ge+-pre-amorphized Si by carbon ion implantation, J. Appl. Phys., Mar. 15, 1999, pp. 3114-3119, vol. 85, No. 6.
Tan et al., Influence of substitutional carbon incorporation on implanted-indium-related defects and transient enhanced diffusion, Appl. Phys. Lett, Nov. 17, 2003, pp. 4169-4171, vol. 83, No. 20.
Tan et al., Leakage Suppression of Gated Diodes Fabricated Under Low-Temperature Annealing With Substitutional Carbon $Si_{1-y}C_y$ Incorporation, IEEE Electron Device Letters, Apr. 2005, pp. 252-254, vol. 26, No. 4.

* cited by examiner

*Primary Examiner* — Ha Tran T Nguyen
*Assistant Examiner* — Suberr Chi
(74) *Attorney, Agent, or Firm* — WPAT, PC; Justin King

(57) ABSTRACT

The invention is directed to a method for manufacturing a semiconductor. The method comprises steps of providing a substrate having a gate structure formed thereon and forming a source/drain extension region in the substrate adjacent to the gate structure. A spacer is formed on the sidewall of the gate structure and a source/drain region is formed in the substrate adjacent to the spacer but away from the gate structure. A bevel carbon implantation process is performed to implant a plurality carbon atoms into the substrate and a metal silicide layer is formed on the gate structure and the source/drain region.

8 Claims, 3 Drawing Sheets

METHOD FOR MANUFACTURING SEMICONDUCTOR DEVICE

BACKGROUND OF THE INVENTION

1. Field of Invention

The present invention relates to a method for manufacturing a semiconductor device. More particularly, the present invention relates to a method for manufacturing a semiconductor device capable of solving junction leakage problem.

2. Description of Related Art

With the decreasing of the size of the integrated circuit and the increasing of the integration of the integrated circuit, the line width, junction area and junction depth are decreased. To effectively increase the functionalities of the device and to decrease the resistance and signal transmission delay due to the resistance and the capacitance, the metal silicide is formed at the junction region to effectively decrease the contact resistance.

In the well known self-aligned metal silicide manufacturing process, nickel silicide is formed at the surfaces of the gate, the spacer and the source/drain region of the metal-oxide semiconductor. However, nickel silicide possesses piping and spiking problems. That is, after the nickel silicide is formed, the nickel silicide diffuses into the substrate and the channel regions and the diffusion of the nickel silicide leads to current leakage. Therefore, to solve the problem mentioned above, a pre-amorphous implantation (PAI) process is commonly performed before the nickel silicide is formed so as to implant dopants including indium into the silicon substrate. Hence, the silicon surface is converted into an amorphous silicon structure. Therefore, the nickel piping and spiking phenomenon can be avoided.

Nevertheless, during the pre-amorphous implantation is performed, the end-of-range defect leads to a lot of defects generating at the surface of the source/drain region. Therefore, the junction leakage seriously happens at the source/drain region.

SUMMARY OF THE INVENTION

Accordingly, at least one objective of the present invention is to provide a method for manufacturing a semiconductor device capable of improving the junction leakage phenomenon.

At least another objective of the present invention is to provide a method for manufacturing a semiconductor device capable of increasing the efficiency of the semiconductor device.

To achieve these and other advantages and in accordance with the purpose of the invention, as embodied and broadly described herein, the invention provides a method for manufacturing a semiconductor. The method comprises steps of providing a substrate having a gate structure formed thereon and forming a source/drain extension region in the substrate adjacent to the gate structure. A spacer is formed on the sidewall of the gate structure and a source/drain region is formed in the substrate adjacent to the spacer but away from the gate structure. A bevel carbon implantation process is performed to implant a plurality carbon atoms into the substrate and a metal silicide layer is formed on the gate structure and the source/drain region.

According to the aforementioned method of one embodiment of the present invention, the bevel carbon implantation process is performed after the gate structure is formed and before the source/drain extension region is formed.

According to the aforementioned method of one embodiment of the present invention, the bevel carbon implantation process is performed after the source/drain extension region is formed and before the spacer is formed.

According to the aforementioned method of one embodiment of the present invention, the bevel carbon implantation process is performed after the spacer is formed and before the source/drain region is formed.

According to the aforementioned method of one embodiment of the present invention, the bevel carbon implantation process is performed after the source/drain region is formed and before the metal silicide layer is formed.

According to the aforementioned method of one embodiment of the present invention, the method further comprises a step of performing a thermal process after the source/drain region is formed and before the metal silicide layer is formed and the bevel carbon implantation process is performed after the source/drain region is formed and before the thermal process is performed.

According to the aforementioned method of one embodiment of the present invention, the method further comprises a step of performing a pre-amorphous implantation process after the thermal process is performed and before the metal silicide layer is formed.

According to the aforementioned method of one embodiment of the present invention, the method further comprises a step of performing a pre-amorphous implantation process after the source/drain region is formed and before the metal silicide layer is formed.

According to the aforementioned method of one embodiment of the present invention, the bevel carbon implantation process is performed after the source/drain region is formed and before the pre-amorphous implantation process is performed.

According to the aforementioned method of one embodiment of the present invention, the dosage of bevel carbon implantation process is about $1\times10^{14}$~$5\times10^{15}$ atom/cm$^2$.

According to the aforementioned method of one embodiment of the present invention, an implantation energy of the bevel carbon implantation process is about 1~12 KeV.

According to the aforementioned method of one embodiment of the present invention, an implantation angle of the bevel carbon implantation process is about 0~45 degree.

The present invention also provides a method for manufacturing a semiconductor device. The method comprises steps of providing a substrate having a gate structure formed thereon and forming a source/drain extension region in the substrate adjacent to the gate structure. A co-implantation process is performed and a spacer is formed on the sidewall of the gate structure. A source/drain region is formed in the substrate adjacent to the spacer but away from the gate structure and a bevel carbon implantation process is performed to implant a plurality of carbon atoms into the substrate. A metal silicide layer is formed on the gate structure and the source/drain region.

According to the aforementioned method of one embodiment of the present invention, the bevel carbon implantation process is performed after the source/drain extension region is formed and before the co-implantation process is performed.

According to the aforementioned method of one embodiment of the present invention, the bevel carbon implantation process is performed after the co-implantation process is performed and before the spacer is formed.

According to the aforementioned method of one embodiment of the present invention, a plurality of dopants used in the co-implantation process include carbon and fluorine.

In the present invention, the carbon atoms are implanted into the substrate so that the junction leakage problem caused by the pre-amorphous implantation can be avoided. Therefore, the efficiency of the semiconductor device can be improved. Furthermore, the more thermal budgets the boding between the carbon and the silicon of the substrate can bear, the more opportunities for entering the interstitial positions the carbon atoms can get. Hence, the boundary defect can be effectively improved.

Moreover, since the carbon atoms are implanted into the substrate, the problem of the lateral diffusion and the vertical diffusion of the nickel silicide can be overcome by utilizing the bonding between the carbon atom and the silicon atom of the substrate even without performing the pre-amorphous implantation process. Accordingly, the process procedure can be simplified.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
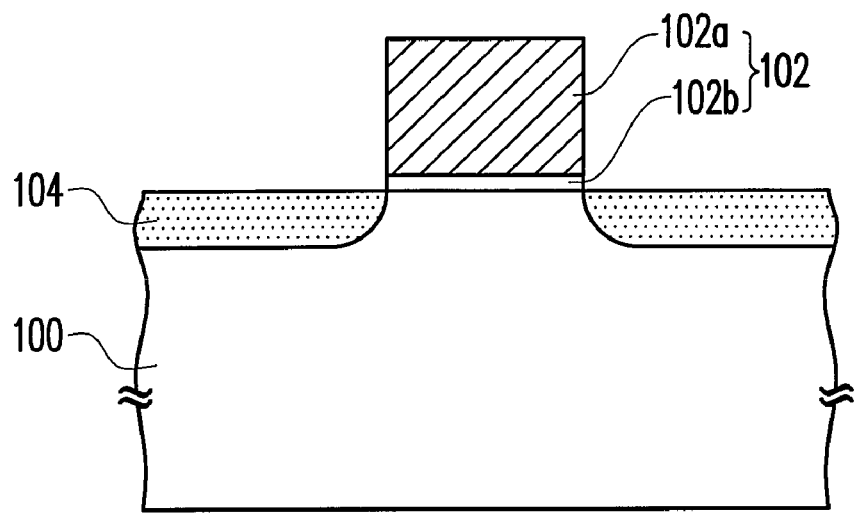
FIGS. 1A through 1E are cross-sectional views schematically illustrating a method for forming a semiconductor device according to a preferred embodiment of the invention.

FIGS. 1A through 1E are cross-sectional views schematically illustrating a method for forming a semiconductor device according to a preferred embodiment of the invention. As shown in FIG. 1A, a gate structure 102 composed of a gate 102a and a gate dielectric layer 102b is formed on a substrate 100. The method for forming the gate structure 102 can be, for example, comprises steps of forming a dielectric material layer (not shown) and a gate material layer (not shown) over the substrate 100 sequentially and then patterning the gate material layer and the dielectric material layer into the gate structure 102 by using the photolithography process and the etching process. The dielectric material layer can be, for example but not limited to, made of silicon oxide, silicon nitride or silicon-oxy nitride. The gate material layer can be, for example, made of polysilicon or metal. Then, a source/drain extension region 104 is formed in the substrate 100 adjacent to the gate structure 102. The method for forming the source/drain extension region 104 comprises a step of performing an ion implantation process to implant dopants with P or N conductive type into the substrate 100 by using the gate structure 102 as a mask.

Figure 1B:
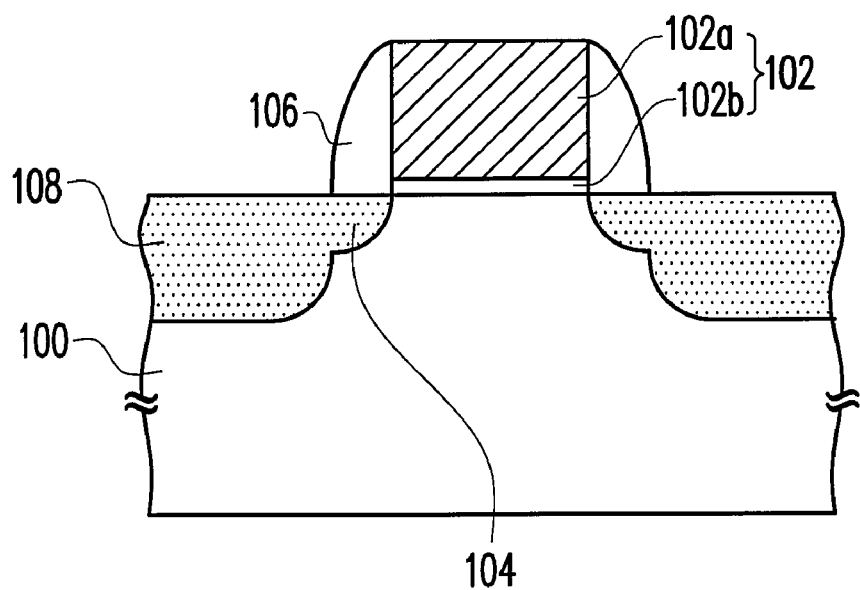

As shown in FIG. 1B, a spacer 106 is formed on the sidewall of the gate structure 102. The method for forming the spacer 106 comprises steps of forming a spacer material layer (not shown) over the substrate 100 and then performing an anisotropic etching process. The spacer material layer can be, for example but not limited to, made of silicon oxide, silicon nitride or silicon-oxy nitride. Then, a source/drain region 108 is formed in the substrate 100 adjacent to the spacer 106 but away from the gate structure 102. The method for forming the source/drain region 108 comprises a step of performing an ion implantation process by using the spacer 106 and the gate structure 102 as a mask, wherein the conductive type of the dopants for forming the source/drain region 108 is as same as that for forming the source/drain extension region 104.

Figure 1C:
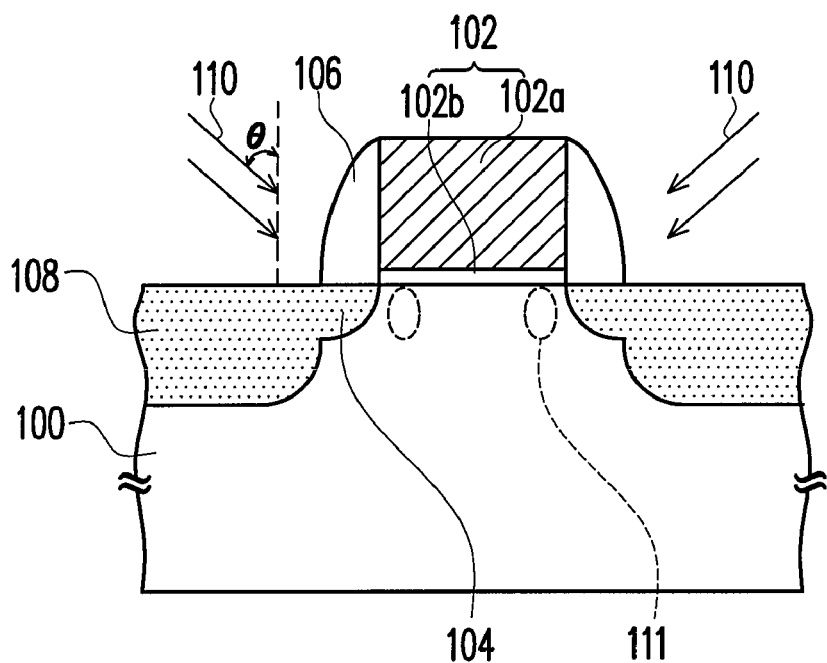

As shown in FIG. 1C, a bevel carbon implantation process 110 is performed to implant carbon atoms into region 111. The implantation dosage of the bevel carbon implantation process 110 is about $1 \times 10^{14} \sim 5 \times 10^{15}$ atom/cm$^2$ and the implantation energy of the bevel carbon implantation process is about 1~12 KeV. Furthermore, the implantation angle θ of the bevel carbon implantation process is about 0~45 degree. Moreover, a thermal process is selectively performed to recover the damaged lattice structure of the source/drain region 108 due to ion implantation. The thermal process can be, for example, a rapid annealing process.

Figure 1D:
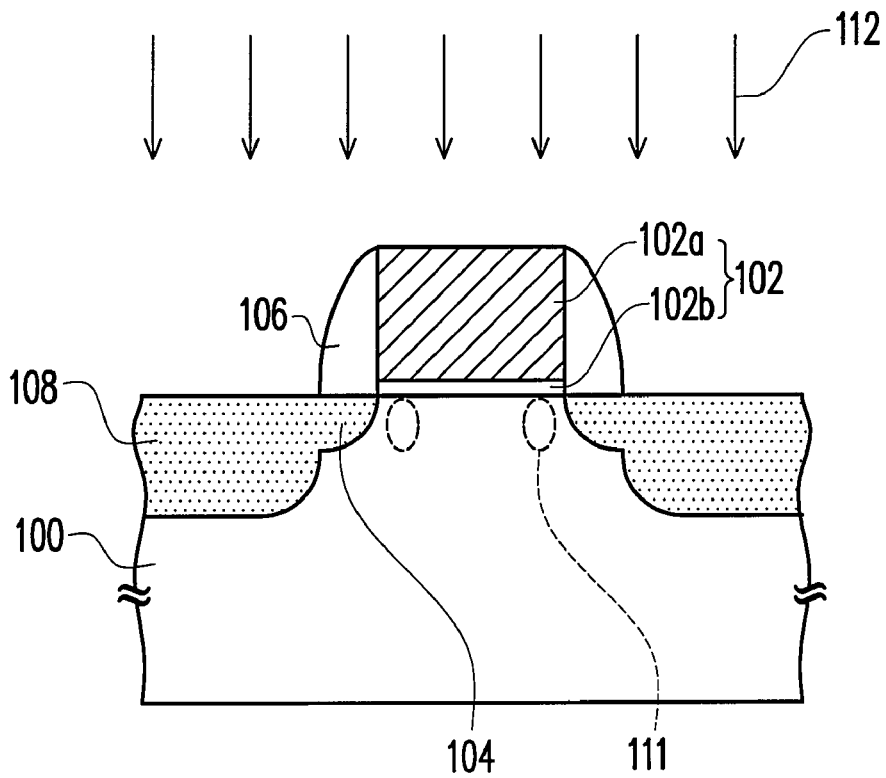

As shown in FIG. 1D, a pre-amorphous implantation process 112 is selectively performed on the source/drain region 108. The dopants of the pre-amorphous implantation process 112 can be, for example but not limited to, arsenic, germanium or indium. Additionally, the implantation dosage of the pre-amorphous implantation process 112 is about $1 \times 10^{14}$ atom/cm$^2$ and the implantation energy of the pre-amorphous implantation process 112 is about 20 KeV. In FIG. 1C, the carbon atoms are implanted into the substrate 100 so that the empty holes at the surface of the source/drain 108 due to the boundary defect can be avoided during the pre-amorphous implantation process 112.

Figure 1E:
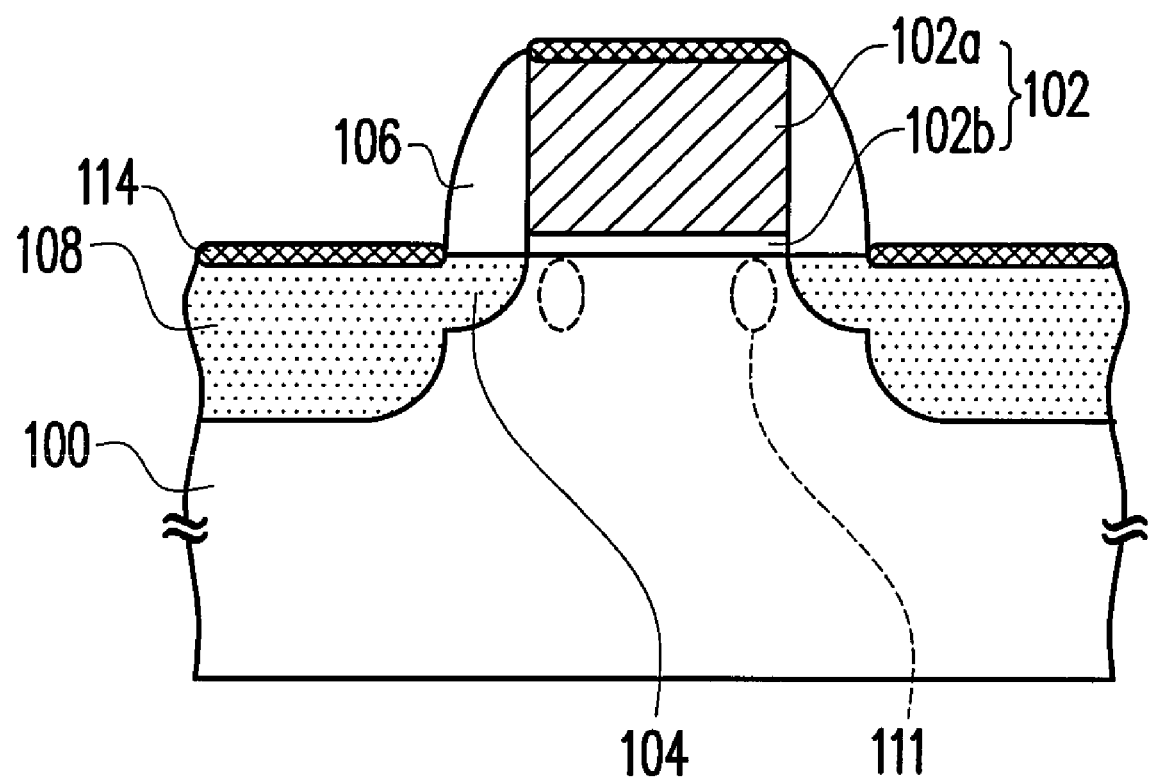

As shown in FIG. 1E, a metal silicide layer 114 is formed on the gate structure 102 and the source/drain region 108. The metal silicide layer 114 can be, for example, made of tungsten silicide titanium silicide, cobalt silicide, molybdenum silicide, nickel silicide, palladium silicide, platinum silicide or other well known material. The method for forming the metal silicide layer 114 can be, for example, a self-aligned metal silicide process.

It should be noticed that since, after the source/drain region 108 is formed, the lattice structure of the substrate 100 is damaged by the ion implantation, there are many intervals in the substrate 100 before the thermal process is accomplished. Moreover, the diffusion phenomenon of the source/drain extension region 104 happens while the thermal process is performed so that a so-called temporary transient enhanced diffusion phenomenon happens. Therefore, as the size of the semiconductor device is developed to be below deep sub-micron and the length of the channel of the metal-oxide semiconductor transistor is getting smaller and smaller, it is necessary to carefully control the diffusion range of the source/drain extension region 104 so as to avoid the short channel effect due to the shrinkage of the channel. To overcome the problem mentioned above, in one embodiment, a co-ion implantation process is performed, on the substrate 100 to implant dopants, such as carbon atoms or fluorine atoms, into the substrate 100 after the source/drain extension region 104 is formed and before the spacer 106 is formed. As for the P-type metal-oxide semiconductor transistor, the dopants can be implanted into the substrate in a manner of straight implantation or oblique implantation. As for the N-type metal-oxide semiconductor transistor, the dopants can be implanted into the substrate in a manner of straight implantation.

The step of performing the bevel carbon implantation process 110 after the source/drain region 108 is formed is used to describe the present invention in the aforementioned embodiment. However, in practice, the bevel carbon implantation process 110 of the present invention can be performed as long as it is performed before the pre-amorphous implantation process 112. The detail description is mentioned as following.

In one embodiment, the bevel carbon implantation process 110 can be performed before the source/drain extension region 104 is formed. Alternatively, the bevel carbon implantation process 110 can be performed after the source/drain extension region 104 is formed and before the ion implantation process, such as carbon ion implantation process or fluorine ion implantation process, is performed. Furthermore, in another embodiment, the bevel carbon implantation process 110 can be performed after the ion implantation process, such as carbon ion implantation process or fluorine ion implantation process, is performed and before the spacer is formed. In the other embodiment, the bevel carbon implantation process 110 can be performed after the spacer is formed and before the source/drain region 108 is formed. Alternatively, in the other embodiment, the bevel carbon implantation process 110 can be performed after the source/drain region 108 is formed and before the thermal process is performed. In addition, the carbon implantation process 110 can be performed during the well region is performed or the threshold voltage adjustment is performed.

Altogether, during the well known process for manufacturing the metal-oxide semiconductor transistor, before every step prior to the pre-amorphous implantation process, the carbon atoms can be implanted into the substrate to avoid the junction leakage problem caused by the pre-amorphous implantation process. Therefore, the efficiency of the semiconductor device can be improved. Furthermore, the more thermal budgets the boding between the carbon and the silicon of the substrate can bear, the more opportunities for entering the interstitial positions the carbon atoms can get. Hence, the boundary defect can be effectively improved.

Moreover, since the carbon atoms are implanted into the substrate, the problem of the lateral diffusion and the vertical diffusion of the nickel silicide can be overcome by utilizing the bonding between the carbon atom and the silicon atom of the substrate even without performing the pre-amorphous implantation process. Accordingly, the process procedure can be simplified.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for manufacturing a semiconductor device, comprising:
    providing a substrate having a gate structure formed thereon;
    forming a source/drain region in the substrate;
    performing a carbon implantation process to implant a plurality of carbon atoms into the substrate under a corner of the gate structure;
    forming a metal silicide layer on the gate structure and the source/drain region; and
    performing a thermal process after the source/drain region is formed and before the metal silicide layer is formed and the carbon implantation process is performed after the source/drain region is formed and before the thermal process is performed.

2. The method of claim 1, further comprising a step of forming a source/drain extension region in the substrate adjacent to the gate structure before the source/drain region is formed.

3. The method of claim 2, further comprising a step of performing a co-implantation process after the source/drain extension region is formed and before the source/drain region is formed, wherein a dopant used in the co-implantation process includes carbon or fluorine.

4. The method of claim 3, further comprising a step of forming a spacer on the sidewall of the gate structure after the co-implantation process is performed and before the source/drain region is formed.

5. The method of claim 1, wherein a dosage of the carbon implantation process is about $1 \times 10^{14} \sim 5 \times 10^{15}$ atom/cm$^2$.

6. The method of claim 1, wherein an implantation energy of the carbon implantation process is about 1~12 KeV.

7. The method of claim 1, wherein an implantation angle of the carbon implantation process is about 0~45 degrees.

8. The method of claim 1 further comprising a step of performing a pre-amorphous implantation process after the thermal process is performed and before the metal silicide layer is formed.

* * * * *